(12) United States Patent
Jonczyk et al.

(10) Patent No.: US 7,456,084 B2
(45) Date of Patent: Nov. 25, 2008

(54) METHOD OF USING A SETTER HAVING A RECESS IN MANUFACTURING A NET-SHAPE SEMICONDUCTOR WAFER

(75) Inventors: Ralf Jonczyk, Wilmington, DE (US);
Scott L. Kendall, Lincoln University, PA (US); James A. Rand, Landenberg, PA (US)

(73) Assignee: Heritage Power LLC, Atlanta, GA (US)

( * ) Notice: Subject to any disclaimer, the term of this patent is extended or adjusted under 35 U.S.C. 154(b) by 364 days.

(21) Appl. No.: 11/046,535

(22) Filed: Jan. 28, 2005

(65) Prior Publication Data

US 2005/0176218 A1 Aug. 11, 2005

Related U.S. Application Data

(63) Continuation of application No. PCT/US03/023401, filed on Jul. 25, 2003.

(60) Provisional application No. 60/404,506, filed on Aug. 19, 2002, provisional application No. 60/399,803, filed on Jul. 31, 2002.

(51) Int. Cl.
*H01L 21/322* (2006.01)

(52) U.S. Cl. ............... 438/476; 438/477; 438/906; 438/958; 257/E21.002; 117/101

(58) Field of Classification Search .......... 438/476, 438/477, 906, 958, FOR. 450; 117/101; 257/E21.002
See application file for complete search history.

(56) References Cited

U.S. PATENT DOCUMENTS

| | | | |
|---|---|---|---|
| 3,767,481 A | 10/1973 | Ettenberg et al. | |
| 3,990,392 A | 11/1976 | Andre | |
| 4,101,759 A | 7/1978 | Anthony et al. | |
| 4,221,956 A | 9/1980 | Fielding | |
| 4,873,063 A | 10/1989 | Bleil | |
| 5,074,952 A | 12/1991 | Zavracky et al. | |
| 5,156,881 A | 10/1992 | Okano et al. | |
| 5,223,079 A * | 6/1993 | Leung et al. | 117/61 |
| 5,304,357 A | 4/1994 | Sato et al. | |
| 5,336,335 A | 8/1994 | Hall et al. | |
| 5,496,416 A | 3/1996 | Hall et al. | |
| RE36,156 E | 3/1999 | Hall et al. | |
| 5,997,795 A | 12/1999 | Danforth et al. | |
| 6,111,191 A | 8/2000 | Hall et al. | |
| 6,114,052 A * | 9/2000 | Maekawa et al. | 428/636 |
| 6,207,891 B1 | 3/2001 | Hall et al. | |

FOREIGN PATENT DOCUMENTS

| | | |
|---|---|---|
| DE | 1 794 065 | 10/1971 |
| FR | 2 245 403 | 9/1973 |

* cited by examiner

*Primary Examiner*—Thanh V Pham
(74) *Attorney, Agent, or Firm*—Burr & Brown (57) ABSTRACT

There is provided a method of fabricating a wafer, comprising depositing semiconductor material into a recess in a setter, moving the setter through a heating/cooling region to subject the semiconductor material to a temperature profile, and removing a wafer from the recess. The size and shape of the wafer are substantially equal to the size of the wafer when it is used. As a result, the wafer can be fabricated in any desired shape and with any of a variety of surface structural features and/or internal structural features. The temperature profile can be closely controlled, enabling production of wafers having structural features not previously obtainable. There are also provided wafers formed by such methods and setters for use in such methods.

33 Claims, 5 Drawing Sheets

METHOD OF USING A SETTER HAVING A RECESS IN MANUFACTURING A NET-SHAPE SEMICONDUCTOR WAFER

CROSS-REFERENCE TO RELATED APPLICATIONS

This application is a continuation of PCT application PCT/US2003/023401, filed Jul. 25, 2003, the entirety of which is incorporated herein by reference.

This application claims the benefit of U.S. Provisional Patent Application No. 60/399,803, filed Jul. 31, 2002, the entirety of which is incorporated herein by reference.

This application claims the benefit of U.S. Provisional Patent Application No. 60/404,506, filed Aug. 19, 2002, the entirety of which is incorporated herein by reference.

FIELD OF THE INVENTION

The present invention relates to manufacturing substantially net shape semiconductor wafers. In particular, the present invention relates to efficiently fabricating net shape wafers having desired three-dimensional shapes, surface features or patterning and/or internal features. The present invention is further directed to enabling precise control of conditions during such fabricating, in order to impart favorable properties to the wafer and, in the case of semiconductor wafers for solar-electric devices, to minimize the cost of semiconductor material consumed per watt of solar energy obtained.

BACKGROUND OF THE INVENTION

Wafers formed of semiconductor material are needed for a variety of applications, and there is an ever-increasing demand for such wafers in most, if not all, of such applications.

Currently, silicon is the most commonly used semiconductor material for making semiconductor wafers. Accordingly, where the expression "semiconductor" or the expression "semiconductor material" is used herein, the discussion in particular relates to silicon. However, those of skill in the art will readily appreciate that in many instances, other semiconductor materials could be substituted for silicon with analogous results.

For example, solar-electric systems employ a semiconductor substrate, typically made of silicon (single crystal or polycrystalline), especially for deployment at or near the surface of the earth. Solar-electric systems have become more and more common, and of greater and greater importance. The use of solar-electric systems is expected to increase, potentially dramatically. As such, improvements in solar-electric technology, even incremental improvements, are of great importance. Although the expression "solar-electric" is used herein, persons of skill in the art will recognize that the discussion applies to all kinds of photovoltaic materials, systems and phenomena.

A significant portion of the cost of such semiconductor wafers is the raw semiconductor material itself. For example, in the case of solar-electric systems, a primary factor which has limited the use of such systems is the cost of the semiconductor material in the semiconductor wafers (in particular, silicon) needed for such systems.

A wide variety of methods exist for producing semiconductor wafers. For example, polycrystalline silicon wafers for use in solar cells have been produced by melting a high-purity material to which a dopant such as phosphorus, boron, gallium, antimony or the like is added, has been added, or will be added, in an inert atmosphere in a crucible, depositing the resulting silicon melt and cooling to form a polycrystalline ingot, and slicing the ingot with a wire saw or an inner diameter blade, thereby obtaining wafers. In such processes, a great deal of silicon is lost as kerf during such slicing, bringing about a potentially significant reduction in yield. In addition, sawing is capable only of providing a substantially straight cut, i.e., any patterning on the cut surfaces (or internal structuring within the wafer) has to be accomplished in a subsequent step, e.g., by grinding, etching, lasering, drilling, etc. Such grinding, etching, lasering or drilling results in further losses of semiconductor material, requires time for such processing, and requires expensive equipment.

In another group of processes, e.g., as disclosed in U.S. Pat. No. RE 36,156, granular silicon is applied to a belt or a setter, the silicon (along with the belt or setter) is then subjected to a thermal sequence to form a sheet of silicon, the sheet is then removed from the belt or setter, and the sheet is then sized by sawing or scribing. Such processes likewise involve losses due to sawing or scribing, such sawing and scribing requires significant effort to obtain accuracy, and any patterning on the surfaces of the wafers or internal structuring of the wafers generally has to be accomplished in a subsequent step, e.g., by grinding, etching, lasering, drilling, etc.

There is an ongoing need for a continuous method, and apparatus for use in carrying out such a method, for converting semiconductor material, e.g., silicon, into wafers, which method minimizes consumption of the semiconductor material, which produces high quality wafers and which can be employed using lower grade raw semiconductor material.

In particular, there is a need for a method and apparatus as described above which can produce wafers having low residual stress. Such wafer must have at least acceptable electrical and optical properties. There is further a need for such wafers which have improved or outstanding electrical and optical properties.

It would further be highly desirable to be able to produce wafers having any desired three-dimensional shape, without having to carry out post-fabrication steps (e.g., sawing, grinding, etching, lasering, drilling, etc.) to form such a shape.

In addition, it would be desirable to provide a method, or apparatus for use in carrying out such a method, in which overall wafer uniformity is improved, and in which thermal treatment of the semiconductor material out of which the wafers are manufactured can be more closely controlled.

BRIEF SUMMARY OF THE INVENTION

According to the present invention, there is provided a method for fabricating semiconductor material, e.g., silicon, into wafers having any desired three-dimensional shape, without having to carry out post-fabrication steps, and apparatus for use in carrying out such a method. The present invention makes it possible to very closely control thermal treatment of the semiconductor material while fabricating the wafers. There is further provided such a method which can be carried out continuously, which can minimize consumption of the semiconductor material, which can produce high quality wafers, and which can do so despite, if desired, using lower grade raw semiconductor material. Further, the present invention can produce wafers having low residual stress, excellent electrical and optical properties, and very high uniformity from one wafer to another.

According to the present invention, there is provided a method for producing substantially net shape wafers, comprising depositing semiconductor material into one or more recesses provided on a first side of a setter, subjecting the semiconductor material to a heating and cooling profile as it passes (at least once), while contained within the recess or recesses, through different zones of a heating/cooling region, and removing from each recess a solidified substantially net shape wafer, i.e., a wafer which has the approximate or exact dimensions it will have in use. In this sense, "use" refers to use of the wafer as a finished product, or as an intermediate product, e.g., for application of additional functional layers, or solar cell fabrication steps such as surface preparation, junction formation, electrical contacts formation and anti-reflection coating.

In a preferred aspect of the present invention, each recess is of a specifically desired shape and/or has a specifically desired surface and/or edge topography for imparting to the wafers one or more desired surface feature and/or pattern and/or one or more desired internal feature.

For example, the recesses can each be of any desired overall shape, and the recesses dictate the shape of the resulting wafers. Accordingly, the recesses can provide for round wafers, square wafers, rectangular wafers, hexagonal wafers, triangular wafers, wafers in the shapes of letters, etc., and can, for example, provide for rounded corners on such shapes which have corners.

A variety of surface patterns and/or features can be imparted to wafers by the recesses, e.g., a pattern of ridges and valleys for enhancing the optical and electrical properties of a solar cell made using the wafer, flattened areas for formation of a contact or bus, ridges and/or valleys for indexing the wafer in a downstream process, surfaces or grooves for directing flow of metallizations, dopants, dielectric precursors, etc.

A variety of features can be imparted to wafers by the recesses. For example, as described in more detail below, the recess can include a shape projecting from the bottom of the recess which results in the formation of a hole passing through part or all of the thickness of the wafer, the recess can impart rounded edges to the wafer, the recess can provide for sacrificial ridges for facilitating junction isolation, the recess can provide for thickened edges on the wafer for thermal capture in order to avoid edge retraction on cooling, etc.

In addition, surface patterns and/or features can be imparted to the side of the wafer which is opposite to the bottom region of the recess in which the wafer is formed either while the semiconductor material is heated or after the wafer is completed. For example, as discussed below, a setter lid can be placed above the recess, and/or one or more scraper bars and/or texturing or molding elements can come into contact with the side opposite the bottom region of the recess.

The invention may be more fully understood with reference to the accompanying drawings and the following description of the embodiments shown in those drawings. The invention is not limited to the exemplary embodiments and should be recognized as contemplating all modifications within the skill of an ordinary artisan.

DETAILED DESCRIPTION OF THE INVENTION

As mentioned above, the present invention provides a method which comprises depositing semiconductor material into one or more recesses provided on a first side of a setter.

According to the present invention, the semiconductor material which is deposited in the recesses can be any material which is desired to be fabricated in the form of a wafer. The material out of which wafers are most commonly constructed, especially in the solar-electric art, is silicon. However, those of skill in the art will readily appreciate that the present invention is applicable to other semiconductor materials, e.g., germanium, gallium antimonide, etc.

The preferred semiconductor material for use in accordance with the present invention is silicon. Where the expression "semiconductor" is used, therefore, silicon is typically the material which is employed and which should be contemplated. However, as noted above, the present invention is applicable to other semiconductor materials, e.g., germanium, gallium antimonide, etc. Where the specification refers to silicon (or silicon compounds), those of skill in the art can readily appreciate situations where other semiconductor materials (or compounds) function in a way similar to the way silicon (or silicon compounds) function.

The semiconductor material is preferably in the form of a granular powder. A variety of methods for converting semiconductor material, e.g., silicon, from a raw material or from scrap material, into granular powder of a desired purity are well known, and do not need to be described here. For example, there are well known methods for milling semiconductor material, e.g., silicon, to a desired particle size and/or purifying such semiconductor material to a desired level of contaminants and/or to reduce specific contaminants to desired maximum allowable levels.

The granular semiconductor material is preferably properly sized and of desired purity. The range of size for the granular semiconductor material is preferably between 20 and 1000 micrometers. The upper limit preferably does not exceed the depth of the recess or recesses in the setter. Where the semiconductor material is silicon, the maximum size of the silicon powder is preferably not more than 500 microns. The lower size limit of the particle distribution is dependent on the dynamics of the melting process, and the extent to which there is a desire to limit the amount of oxide (e.g., silicon oxide, where the semiconductor material is silicon). Silicon oxide is a source of contamination, and tends to naturally occur at silicon surfaces. In addition, as described below, it may be desirable to provide a "net" structure below the molten silicon. In addition to the silicon material itself, other materials incorporated in a substrate designed to be thermally matched to silicon can be employed as a non-reusable net material. Other materials including fabrics that are woven or non-woven, such as graphite, can be employed as the net. Other granular materials that are partially melted or unmelted, such as silicon carbide can be employed.

In the case of manufacture of wafers made of silicon, in general, in the past, low-processed metallurgical grade silicon has been deemed to be not adequate for the efficient operation of a solar cell device; highly processed semiconductor grade silicon has been deemed to be not necessary for operation of a solar cell; and mid-grade silicon has been deemed to be acceptable for operation of a solar cell. In accordance with the present invention, in view of the ability to more closely control the temperature treatment (as discussed below) applied to the semiconductor material contained in each recess, it has been found that greater flexibility can be exercised in the selection of the grade of semiconductor material which can be used. For example, lower grade silicon (including scrap silicon) can be employed to grow acceptable wafers due at least in part to the ability to more closely control the temperature treatment of the semiconductor material, and extremely high quality wafers can be made using higher grade silicon.

If desired, one or more p-dopants or n-dopants can be included in the semiconductor material as it is deposited into the recesses or can be added to the semiconductor material after it has been deposited in the recesses. Typically, p-type conductivity is desired for the base region of the wafer (i.e., usually the majority of the wafer), and inclusion of a p-type dopant is usually more suitable at this stage of the process. Preferred elements for p-type doping include boron, aluminum, gallium and indium. For example, a particularly preferred dopant compound which can be added at this stage is powdered boron silicide, which is preferably mixed with the semiconductor material, e.g., silicon, by mechanical mixing.

In addition, one or more additives can be included in the semiconductor material as it is deposited into the recesses or after it has been deposited in the recesses. For example, an additive may be employed to affect the optical bandgap of the wafer (e.g., representative examples of such additives include carbon, which can be added to increase the bandgap, and germanium, which can be added to decrease the optical bandgap). Such changes in the optical bandgap of the wafer material may be deemed to be desirable depending on the spectral output of the incident radiation being employed with a solar cell design.

Furthermore, the material deposited in different regions of the recesses can be closely controlled. For example, the particle size or purity of semiconductor material deposited in one region of a recess, e.g., at the top, can differ from that deposited in another region of a recess, e.g., at the bottom (for instance, it might be desirable to deposit more pure silicon at the top of a recess and less pure silicon at the bottom of a recess in order to produce a wafer in which the top is of better quality and becomes part of the front surface of a solar cell). Another possible feature is to provide different bulk resistivities in different regions of the wafer, e.g., by positioning fine dust layers in specific regions of the material deposited in the recesses.

The setters according to the present invention each have at least one recess. The one or more recesses can be situated in any desired location(s) in the setter. Preferably, a plurality of recesses are provided in each setter. In a preferred aspect of the present invention (i.e., the present invention is not limited to such aspect), there is provided a setter which has at least one recess on each of the major surfaces of the setter. One example of a preferred setter according to the present invention includes a plurality of recesses, e.g., five recesses, on each of a pair of opposite surfaces, the recesses on each surface preferably being arranged in a row, i.e., such that centers of each recess on the first surface define a substantially straight first line, and centers of each recess on the second surface likewise define a different substantially straight second line (preferably parallel to the first line), the setter preferably being symmetrical about a plane passing through both of the first and second lines. By providing recesses on both surfaces of a setter, the setters can be run through the heating/cooling region (described below) with either side facing upward, and can be inverted (between fabrications) in regular intervals (e.g., after each pass through the heating/cooling region) so that warping or other damage due to repeated uneven heating and cooling is eliminated or reduced. In such an instance, the recesses on opposite surfaces of the setter are preferably mirror images of one another.

The setter can be constructed of generally any material which can maintain its shape during the thermal processing (described below). In addition, the setter preferably does not chemically interact with the semiconductor material to any substantial degree, and preferably does not adhere to the semiconductor material. Because the recesses in the setter in which the wafers are formed are relatively small, i.e., do not extend for a distance longer than the longest dimension of the net shape of the wafers, there is less thermal stress on the wafers. For example, as silicon solidifies, it expands slightly; as a setter is cooled during such solidification, it contracts to some degree. However, because of the short dimensions of the recesses in which the wafers are formed, such mismatch has been surprisingly found to not result in such stresses as would cause negative impact on the quality of the wafers. In view of such flexibility and features of the present invention, the thermal characteristics of the setter do not have to be narrowly designed, unlike more stringent requirements found where larger shapes are solidified, which require close thermal expansion/contraction matching between the setters and the semiconductor material being fabricated. Accordingly, the setter can be made of comparatively less expensive materials. The setter material may be rigid or flexible, depending on the material out of which it is made and depending on what is desired.

Representative examples of materials out of which the setter may be formed include graphite, quartz, refractory boards (e.g. silica and/or alumina), silicon nitride and silicon carbide, with graphite being preferred.

In accordance with the present invention, the setters are preferably machined to provide closely defined surface features, patterns and topography as described below. In addition, the ability to more closely control the temperature treatment to which the wafers are subjected during their fabrication, a feature which is enhanced by several factors described herein (including the smaller size, i.e., net shape, of the wafers being fabricated and the dimensionally accurate setters), assists in making it possible to provide wafers which are of such high structural quality that they can be extremely thin. For example, the present invention makes it possible to provide good optical and electrical properties in a wafer that is only 600 micrometers thick, and even in a wafer that is even thinner, e.g., 300 micrometers or less. A machined setter can be machined to as low a resolution as is desired for the structural features desired to be imparted by the setter surfaces to the wafer, e.g., as low as five micrometers or less; as technology advances to efficiently provide even smaller resolution in a machined setter, such resolution can be applied to provide comparably sized structural features in the wafers, as desired.

To assure that the setter does not adhere to the final silicon wafer, a release agent coating is preferably applied to the setter before depositing semiconductor material in the recesses. Preferred release agents include silicon nitride, silicon oxynitride, silica, powdered silicon, alumina, silicon carbide, carbon and combinations thereof. A comparatively inexpensive method for applying a release agent to a setter is to form a liquid slurry containing the release agent, and painting or spraying the slurry on the bare setter, and then preferably drying the slurry before using the setter. The release agent coating may also be applied by any other coating means known in the art. The release agent facilitates separation of the wafer from the setter and preferably permits repeated reuse of the setter.

In a preferred embodiment, the setter material is graphite, and the top surface of the setter is coated with a release agent by painting an aqueous colloidal solution of silicon nitride, and baking the silicon nitride to form a non-wetting, non-adhering oxynitride layer.

The semiconductor material is deposited into the recesses of the setters in any suitable way, a variety of suitable ways being well known, e.g., by metering it from a hopper as the setters pass under the hopper. The semiconductor material is preferably treated by one or more doctor blade, and/or any other suitable method to assist in spreading the semiconductor material more uniformly within the recesses, a variety of spreading methods being well known.

The setters, including the recesses each containing semiconductor material, are then moved through a heating/cooling region including a plurality of temperature-controlled zones, in order to subject the semiconductor material in each recess to a thermal treatment as the semiconductor material in each such recess passes through the different zones.

U.S. Pat. Nos. 6,207,891, 6,111,191, RE 36,156 and 5,496,416, the entireties of which are each hereby incorporated by reference, each describe examples of heating/cooling regions which would be suitable for use in accordance with the present invention.

Figure 1:
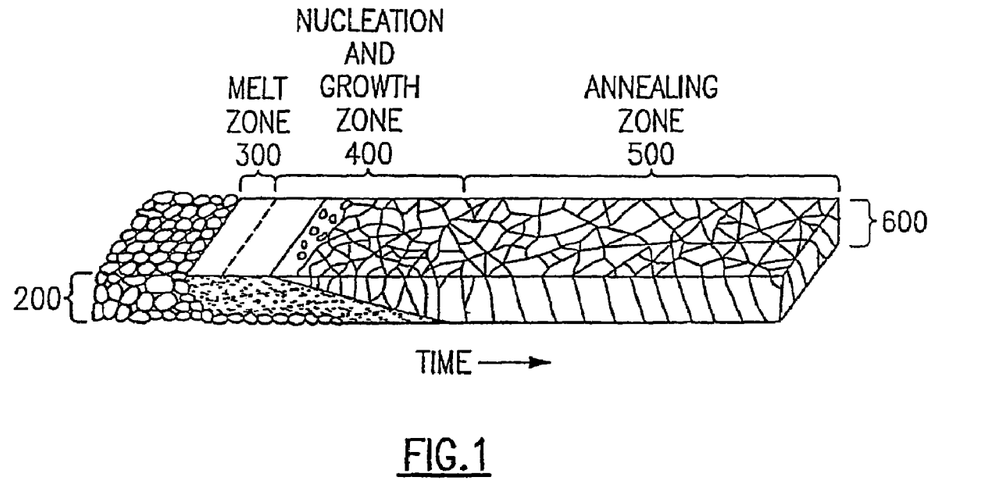
FIG. 1 is a schematic perspective view illustrating an example of a heating/cooling sequence in accordance with the present invention.

FIG. 1 is a schematic perspective view illustrating a representative example of a heating/cooling sequence which is suitable according to the present invention. FIG. 1 depicts stages through which a vertically defined section of a single wafer being fabricated passes, the distance from the left being representative of the length of time elapsed (i.e., movement from left to right in FIG. 1 represents only passage of time).

The thermal profile depicted in FIG. 1 first creates a melt region 300 at the top of the granular semiconductor material 200, and then creates a nucleation and growth region 400 where both liquid and a growing layer of polycrystalline layer coexist (i.e., at or about the melting temperature of the semiconductor material, in the case of silicon, about 1,415 degrees C.). Finally, there is an annealing region 500 where the temperature of the polycrystalline semiconductor shape 600 is reduced in a prescribed manner to effect stress relief. Any or all of the preheat, melting, growth and anneal thermal profiles for the granular powder and resultant shape can be achieved by appropriate placement of heating devices, cooling devices and/or insulation, a wide variety of which are well known to those of skill in the art. For example, heating can be accomplished using an infrared heater or using a line source, such as by optical focusing.

In the process design, the thermal characteristics of the setter play a key role in managing the melt and growth processes. In the melt region 300 in the thermal profile depicted in FIG. 1, it is preferred that the thermal conductivity of the setter be low to assure the efficient deployment of the energy being used to melt the granular semiconductor material 200. The thermal properties of the setter may be tailored to possess one or more strips of higher thermal conductivity. The thermal conductivity of the setter may alternatively or additionally be tailored to include regions which assist in defining nucleation sites to commence growth. This can be accomplished by locally placing thermal shunts in the setter. These shunts provide a thermal conduction path between the top and bottom of the setter, effecting a local path for removing heat of solidification, resulting in sites where nucleated growth occurs.

Figure 2:
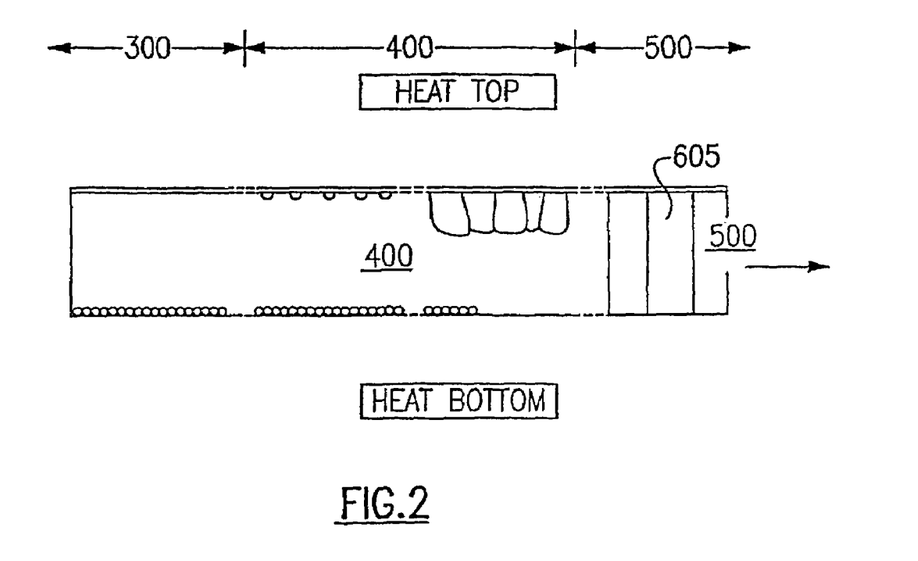
FIG. 2 is a schematic perspective view showing an example of a sequence of nucleation and growth of a semiconductor shape in accordance with the present invention.

After the granular semiconductor material 200 has been deposited in the setter recess, it is transported through a thermal profile for melting, solidification and crystallization as described in our earlier patent, U.S. Pat. No. 6,207,891. FIG. 2 is a schematic perspective showing the sequence of nucleation and growth of the semiconductor shape. In the grain growth process, the rate of grain growth is determined by the details of heat extraction from the melt and the grain size is determined by the nucleation density.

After leaving the nucleation and growth zone 400 of the thermal profile, the shape 600 moves into the annealing zone 500 of the thermal profile. In this zone the grown shape, still at approximately 1,400 degrees C. (in the case of silicon), is subjected to a linear temperature gradient along the direction of setter motion. The linear temperature profile tends to eliminate any buckling and cracking of the as grown shape, and minimizes the generation of dislocations. The grown shape may have generally any size, e.g., major surfaces having surface areas of 1,000 $cm^2$ or less, e.g., 500 $cm^2$ or less, and any thickness, e.g., between about 100 microns and 2 mm, more typically in the range of 350 to 1000 microns (although using the present invention, thickness can be reduced to reduce consumption of semiconductor material). Because the thickness of the final grown shape 600 is determined by the precise application of granular semiconductor material 200 to the setter, exceptional wafer thickness control and process stability are achieved. After cool down, the finished wafer can be removed from the setter, e.g., by vacuum suction, and can be further fabricated, e.g., into solar cells. The setter is reused for making further columnar-grained polycrystalline wafers.

The top-down grain growth process described above results in provision of a device-active region at the top of the shape which is crystallized from the semiconductor melt while the bottom of the shape next to the setter is still solid, thus minimizing any contamination of the top of the shape by the setter. It is a further advantage of the top-down grain growth process that purification of the device-active region is effected by fractional solidification (see: Zief and Wilcox, Fractional Solidification, Marcel Dekker, New York, 1967). By this method, the most pure grown material is at the top of the shape where the initial grain growth occurs. The subsequent grain growth process has the effect of sweeping impurities to the bottom of the solidified shape away from the device-active region (similar to zone refining).

The pulling speed of the setters through the heating/cooling region can be any desired rate, depending on the length of the thermal treatment and the size of each zone within the region. For example, suitable speeds can be greater than about 100 cm/min, preferably about 250 cm/min or higher.

As noted above, in a preferred aspect of the present invention, each recess is of a specifically desired shape and/or has a specifically desired surface and/or edge topography for imparting to the wafers one or more desired surface feature and/or pattern and/or one or more desired internal feature.

For example, the recesses can each be of any desired overall shape, and the recesses dictate the shape of the resulting wafers. For example, as mentioned above, the recesses can provide for round wafers, square wafers, rectangular wafers, hexagonal wafers, triangular wafers, symmetrical or asymmetrical wafers, wafers in the shapes of letters, etc., and can, for example, provide for rounded corners on any such shapes which have corners. Such rounded corners (e.g., having radius of curvature in the range of from about 1 mm to about 20 mm) simplify handling (and make handling more safe) and assist in reducing breakage of the wafers during the fabricating of the wafers as described herein, when the wafers are being treated to apply additional functional layers or when conducting solar cell fabrication steps (such as surface preparation, junction formation, electrical contacts formation or anti-reflection coating), and/or when a completed wafer is being used, e.g., in a solar-electric system. In addition, such rounded corners also reduce potential damage to other components which may come into contact with the wafer, e.g., screens (in cases where metal patterns are applied to the wafers by screenprinting). The formation of rounded corners can be accomplished without loss of semiconductor material because the corners are produced by the shape of the setters, as opposed to having to be shaved off of a wafer.

As noted above, due to the fact that the wafers are fabricated according to the present invention substantially in their net shape, a number of benefits are provided. One such benefit is that the wafers are highly uniform, because they lay flat on the recesses in the setters, and each wafer being fabricated behaves like every other wafer being fabricated. In addition, due to the small (net) shape of the wafers being fabricated, crystal stresses experienced during fabrication are minimized, because the degree of shrinkage within each net shape wafer being fabricated is small enough that the wafers being formed do not tend to buckle or pull up off the bottom regions of the recesses.

A variety of surface patterns and/or surface features can be imparted to the wafers by the surfaces of the recesses, e.g., a pattern of ridges and valleys for enhancing the optical and electrical properties of a solar cell made using the wafer, flattened areas for formation of contacts or buses, guide ridges and/or notches for indexing the wafer in a downstream process, surfaces or grooves for directing flow of metallizations, dopants, dielectric precursors, etc. which are later applied. That is, the recesses can be structured with a "negative pattern" including one or more ridges, valleys, cavities and/or protrusions so that the wafers have a corresponding "positive pattern" including ridges (where the recesses include valleys), valleys (where the recesses include ridges), protrusions (where the recesses include cavities) and/or cavities (where the recesses include protrusions) which facilitate application of a functional element on the wafer, e.g., by roll printing, screenprinting, vapor deposition, liquid phase epitaxy, dripping liquid into one or more cavities or grooves, etc. The ridges can provide raised areas to which another material (e.g., a metal, an insulator, a dopant etc.) can readily be selectively applied, or can provide boundaries for controlling the flow of such a material. Analogously, the valleys and/or cavities can provide low areas which can provide separation between areas of material applied to adjacent raised areas, or can provide channels or pools in which such a material can flow before being solidified. If necessary, after applying such a material, the surface(s) can be treated so as to remove any such applied material from the raised portions (or surrounding portions), leaving the applied material in only the channels or grooves (or cavities), separated by the raised portions (or surrounding portions).

For example, such patterning can be employed where there is a desire for a discontinuous back surface metallization (as well known in the solar-electric art, the back surface is the side of the solar cell which is opposite the surface which faces the light, e.g., sunlight), or a desire for one part of the back surface to be raised relative to other parts (e.g., raised silver stripes on an aluminum back surface), etc. Similarly, such patterning can assist in isolating p-type current bus bars from n-type current bus bars where both types of buses are provided on the back surface (i.e., an all back contact design) by providing a series of grooves and ridges, alternating ridges being electrically connected to the p-region and the n-region, and the grooves assisting in avoiding short circuits between the n-type current bus bars and the p-type current bus bars.

Figure 3:
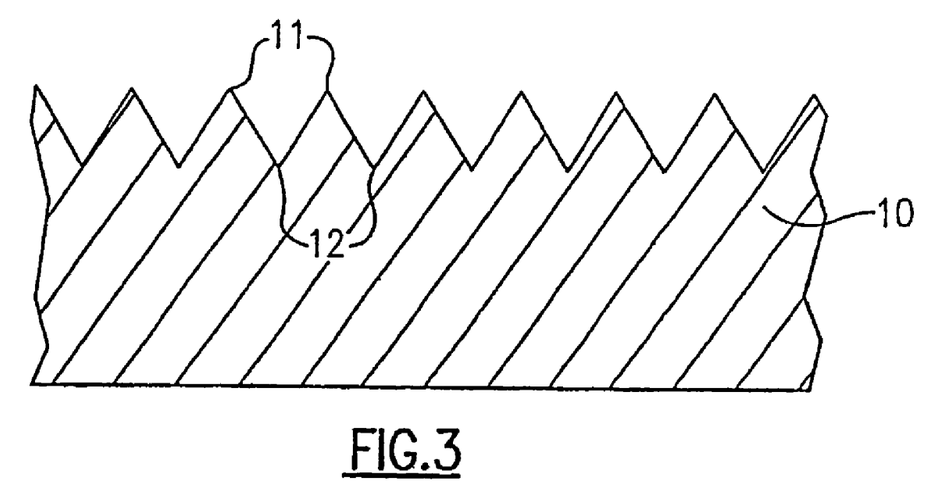
FIG. 3 is a sectional view of an embodiment of a wafer having a textured surface in accordance with the present invention.
Figure 4:
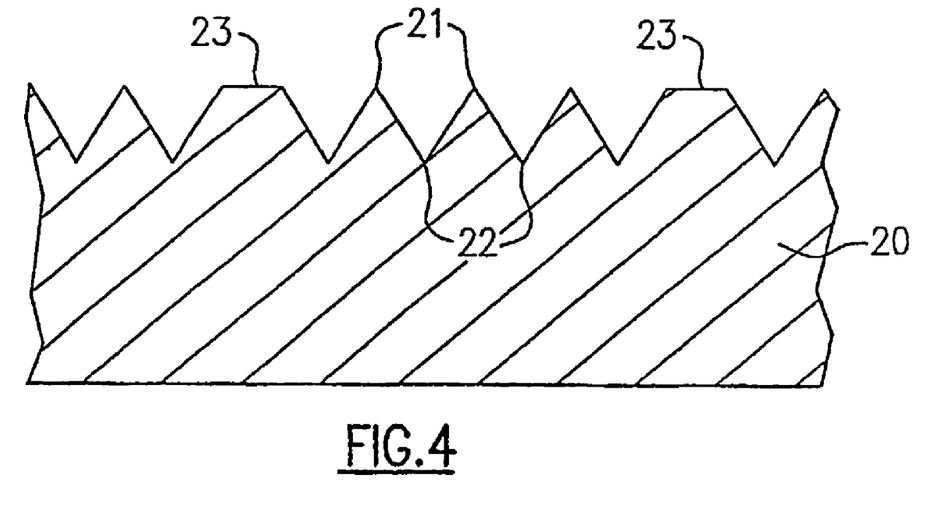
FIG. 4 is a sectional view of an embodiment of a wafer having a textured surface in accordance with the present invention.

Another example of such patterning is where the front surface of the wafer (i.e., the surface which is designed to face the sun) is textured to provide improved optical and electrical properties. For example, it is well known that in many circumstances, by texturing the front surface of the wafer (e.g., a wafer 10 as depicted in cross-section in FIG. 3 which includes ridges 11 and valleys 12), a greater percentage of incident light can be absorbed, and the distance that electrons have to travel in order to reach the p-n junction can be reduced, resulting in greater overall power production. Using the method of the present invention, ridges and valleys of any desired size (down to the resolution to which the setters are machined) can be employed, e.g., having amplitude of from about 50 to about 150 micrometers. If desired, such ridges and valleys (of a similar shape or a different shape) can be provided on both sides of the wafer (such a design can be especially advantageous with a thin wafer, particularly where the back surface is treated to be reflective, or where a reflective layer is applied). In addition, some of the ridges in such a textured surface can be flattened, (e.g., as depicted in FIG. 4, which depicts a wafer 20 in cross-section, including ridges 21 and valleys 22, as well as flattened ridges 23), in order to provide such improved optical and electrical properties, and to facilitate formation of contacts and/or bus bars on the front surface.

Similarly, the wafers can be structured so as to provide specifically desired thermal profile during thermal treatment, e.g., by providing a thickened region which will be heated to a temperature which is lower than if such region were thinner. For example, the edges of the wafer being fabricated can be structured to be thicker in order to pin the edges (i.e., to avoid edge retraction during cooling). In such a way, the thermal treatment can be specifically tailored for different regions of the wafer being fabricated.

A particularly preferred shape for a contact (especially a front surface contact) is one which is narrow but deep, in order to minimize the area over which the contact blocks light from being absorbed in the wafer, while maximizing the cross-sectional area of the contact perpendicular to the direction of current flow through the contact. For such a purpose, a wafer formed according to the present invention can be structured so as to have a groove of such a narrow and deep shape, which is later filled with the contact material (or partially filled with the contact material and then the remainder filled with semiconductor material in order to bury the contact within semiconductor material).

Figure 5:
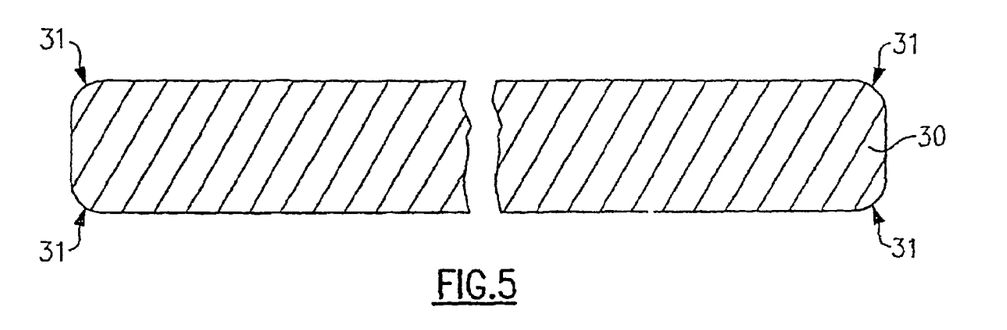
FIG. 5 is a sectional view depicting an embodiment of a wafer which has rounded edges in accordance with the present invention.

Similarly, the negative pattern in the recesses can be structured so as to provide any desired topography on the wafer. Such topography includes the ability to provide wafers having rounded edges, which, similar to the provision of rounded corners, assists in safety and in reducing wafer breakage as well as damage to other equipment and materials which come into contact with the wafers. FIG. 5 is a sectional view depicting a wafer 30 which has rounded edges 31.

In addition, a variety of features can be imparted to wafers by the recesses. For example, each recess can include one or more protrusions projecting from the bottom of the recess, each protrusion resulting in the formation of a hole passing through part or all of the thickness of the wafer (see FIG. 9, discussed below). Such protrusions can be generally any suitable shape which projects upward from the bottom of a recess, and preferred shapes include generally frustoconical shapes and generally cylindrical shapes. Holes passing through part of all of the thickness of the wafer can be used, e.g., to transport electrons from one part of the wafer to another, for example, from the front surface to the back surface (i.e., to provide wrap-around metallization, which enables use of an all-back contact). Where an all-back contact is employed, the size of busbars on the front surface of the wafer can be reduced or the front surface busbars can be eliminated, if desired, e.g., to increase light collection area.

In many circumstances, a structure formed on one side of the wafer is visible in the form of modified grain structure (e.g., larger or smaller grains) on the opposite side, depending, e.g., on the depth of structuring (e.g., typically if greater than about 75 micrometers), the temperature profile to which the wafer is subjected, the thickness of the wafer and the nature of the semiconductor material used to make the wafer. Such phenomena can be used for a variety of design purposes, if desired. It should be noted here that structures formed in the wafers are not required to be symmetrical. In fact, it may be desirable to have non-symmetrical structures of various or varying geometries.

Figure 6:
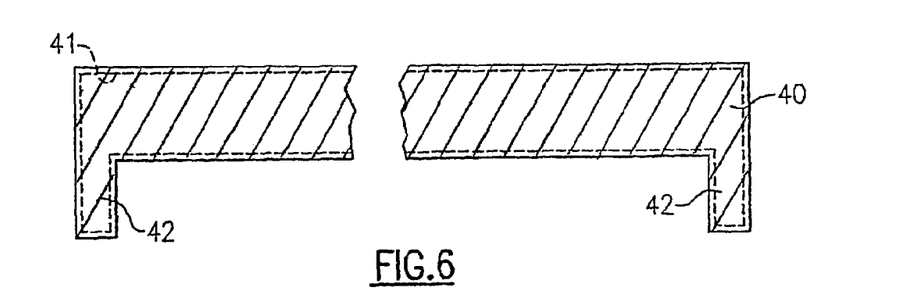
FIG. 6 is a sectional view of an embodiment of a wafer having a p-n junction and a pair of junction isolation ridges in accordance with the present invention.
Figure 7:
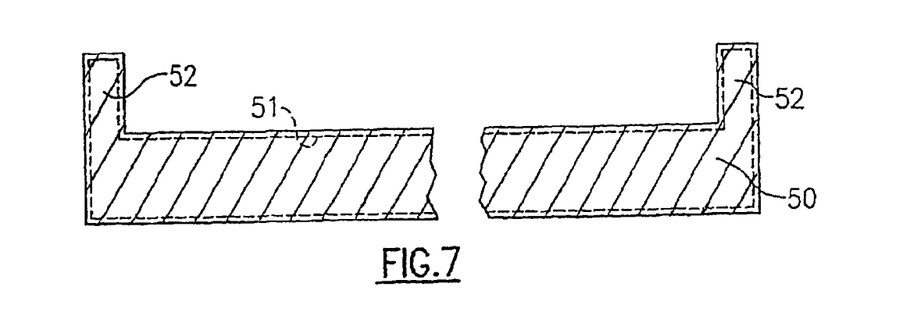
FIG. 7 is a sectional view of an embodiment of a wafer having a p-n junction and a pair of junction isolation ridges in accordance with the present invention.

Another feature which can be provided in the wafers by the shape of the recesses are junction isolation ridges. As is well known, for instance, a typical process involves applying an n-dopant to a previously p-doped wafer (or sometimes applying a p-dopant to a previously n-doped wafer) to provide an n-doped region and a p-n junction. Typically, in such a treatment, a p-n junction is formed around the entire wafer, a slight distance (typically less than a micrometer) below the surface of the wafer. For efficient use, it is desirable for the n-region on the front surface to be electrically isolated (i.e., to be not electrically connected) to any high conductivity region on the back surface, and it is most desirable for the p-n junction to consist of only a substantially flat region just below the front surface of the wafer. In the past, the n-doped layer on the sides of the wafers has typically been removed by eliminating the sides of the wafers, e.g., by dicing them, by physical abrasion, by chemically etching or by plasma etching. In accordance with the present invention, protrusions (referred to herein as junction isolation ridges) can be formed along edges of the wafers (as a result of cavities provided in the recesses), through which the p-n junction, when formed, will pass, and the regions of the p-n junctions on the back surface of the wafer can be isolated from the p-n junction just under the front surface by snapping off the junction isolation ridges. For example, FIGS. 6 and 7 depict sectional views of two embodiments of wafers which exemplify such provision of junction isolation ridges. In FIG. 6, there is shown a sectional view of a wafer 40 having a p-n junction 41 and a junction isolation ridge 42 (formed on the back surface of the wafer 40) which, when snapped off, isolates the n-region on the front surface of the wafer from the high conductivity region on the back surface of the wafer. In FIG. 7, there is shown a sectional view of a wafer 50 having a p-n junction 51 and a junction isolation ridge 52 (formed on the front surface of the wafer 50) which, when snapped off, isolates the n-region on the front surface of the wafer from the remainder of the p-n junction. In addition, the p-n junction on the back surface of the wafer may be eliminated as a result of applying a back surface highly conductive region, e.g., of aluminum, as is well known in the art, which, in connection with the embodiment shown in FIG. 7, provides a wafer in which the p-n junction consists of only a substantially flat region just below the front surface of the wafer.

As mentioned above, another feature which can readily be provided to wafers through structuring of recesses in accordance with the present invention are edge regions on the wafer which are thicker than the remainder of the wafer, e.g., by about 40 to 100 micrometers for a wafer which is about 900 micrometers thick. By providing thicker edge regions in the recesses, as the semiconductor material passes through the zones of the heating/cooling region where the semiconductor material is heated, due to the greater thickness, the semiconductor material in the edges of the recesses will either not melt to as great a degree as does the semiconductor material in the other parts of the recesses, or will solidify before the semiconductor material in the other parts of the recesses, thereby providing "pinning" of the edges, i.e., avoiding retraction of the edges of the wafer during cooling. In addition, due to the close control that can be achieved according to the present invention, e.g., with respect to thermal processing, it is possible to provide wafers having edges with good optical and electrical properties.

Net shape fabrication of wafers allows for a wider process window because of edge pinning and the small lateral dimensions of the wafers. This wide process window makes it possible to use an aggressive melt and longer melt time as well as lower solidification rates. The expression "aggressive melt" encompasses subjecting the semiconductor material to a heat treatment such that for a period of time (e.g., 1 or 2 seconds, 15 seconds or more, or 30 seconds or more), the entirety of the semiconductor material in a recess is molten (i.e., in the liquid phase).

Where an aggressive melt is employed, it is preferred that care be taken to avoid large temperature spikes which may occur upon the entirety of the semiconductor material becoming molten. That is, due to the relatively large heat of fusion of semiconductor materials (e.g., silicon), a significant rate of heat transfer, without significant temperature increase, can be absorbed by the semiconductor material as it is being converted from solid phase to liquid phase-when all of the semiconductor material has become converted to liquid phase, such significant heat transfer rate can rapidly increase the temperature of the semiconductor material. The effects of such potential temperature increase are exacerbated by the fact that the materials out of which the setters are made tend to have a relatively high rate (in comparison to the semiconductor material) of heat absorption. For example, radiant heat is typically used to heat the semiconductor material, and the semiconductor material, e.g., silicon, has a much lower rate of heat absorption than the material out of which the setter is made, e.g., graphite. In the event that the setter reaches a temperature which is significantly higher than the melting temperature of the semiconductor material, the quality of the finished wafer tends to be severely degraded. Accordingly, when using an aggressive melt, it is generally necessary to withdraw heat from the bottom of the setters. Persons of skill in the art are readily familiar with a variety of ways to effect such heat withdrawal, e.g., contact with or proximity to containers through which cooling fluid is passed. After the aggressive melt, the semiconductor material is then further processed to form the wafer, e.g., by subjecting to a top-down solidification as described above.

Aggressive melts and longer melt time have resulted in increases in grain size (e.g., from a range of from 0.2 to 2 mm up to a range of from 5 to 10 mm). A significant increase in collection efficiency has been demonstrated with aggressive melts and longer melt time, as well as with such larger grains.

Preferably, when making wafers for use in production of solar cells, the surface of the wafer which was formed in contact with the bottom region of a recess is the surface which faces away from the incident light (i.e., at least part of it becomes at least part of the back surface of the solar cell), and the opposite surface of the wafer faces the incident light (i.e., at least part of it becomes at least part of the front surface of the solar cell). The topography of the surface of the wafer formed in contact with the bottom region of the recess can readily be controlled by appropriate structuring of the recess. Similarly, the topography of the edges of the wafer can be controlled by appropriate structuring of the recess. Also, as indicated above, holes or cavities in the wafer extending from any part of the wafer which is formed in contact with the recess can be provided by protrusions from the recess. In order to structure the remaining surface of the semiconductor material (i.e., the surface opposite the surface formed in contact with the recess), at least part of which, in the orientation described in this paragraph, becomes at least part of the front surface of the solar cell, a setter lid can be provided which is positioned above the semiconductor material in the recess (e.g., the setter lid can be placed on top of semiconductor material positioned in the recess, so that as the semiconductor material melts and voids between the solid particles disappear so that the top surface of the semiconductor material lowers, the lid lowers with it), or one or more scraper bars, or texturing or molding elements can be provided which come into contact with the semiconductor material on a side of the semiconductor material which is opposite to the side of the semiconductor material which is in contact with the bottom region of the recess (e.g., such scraper bar, or texturing or molding elements can be lowered into the semiconductor material, if necessary, e.g., if the melting of the semiconductor material causes the top surface of the semiconductor material to descend to below the top of the setter). Preferably, shortly after the top surface of the semiconductor material is structured, it is solidified in order to keep such structure. Such a setter lid also serves to protect the wafer being fabricated from impurities in the area which might otherwise migrate into the semiconductor material.

Alternatively (or additionally), the wafer can be fabricated in an inverted orientation, with the surface which is to become at least part of the front surface of the solar cell being in contact with the bottom region of the recess, and directional solidification being conducted from the bottom up. In such a case, the heating/cooling profile could be modified so as to compensate for the inverted orientation, and to compensate for any other thermal factors, e.g., that the heat from the heaters below the setters must pass through the setters before reaching the semiconductor material. In addition, in such a case, potential contamination from the setter and/or any release agent applied to the setter needs to be addressed and/or taken into consideration, because the crystal structure of the front surface has profound effects on the overall properties of the solar cell.

In addition, as mentioned above, the sidewalls of the recesses in the setters can be shaped so as to have a taper, i.e., the cross-sectional area of the recess increases as a distance from the bottom region of the recess increases, such that expansion of the silicon upon solidification merely tends to push the shapes within the recesses upward a slight distance. Any suitable degree of taper can be employed, and the degree of taper can vary around the sidewall of the recess in the lateral and/or vertical dimension. An example of a suitable degree of taper can be about 15 degrees.

The net shape product of the present invention is then removed from the setters, e.g., using vacuum suction. If desired, such a wafer can be sent through the heating/cooling region a second time (or more times). Doing so can provide even better structural quality of the semiconductor material in the wafer. Due in large part to the net shape aspect of the present invention, such refabricating can be accomplished without excessive stress on the wafer, without affecting yield and without jamming the fabrication apparatus. The completed wafer, being of net shape, does not need to be sized. As a result, the wafers of the present invention are mechanically more stable due to grown rather than cut edges, and the occurrence of micro-cracks caused by sawing or the like is avoided.

Figure 8:
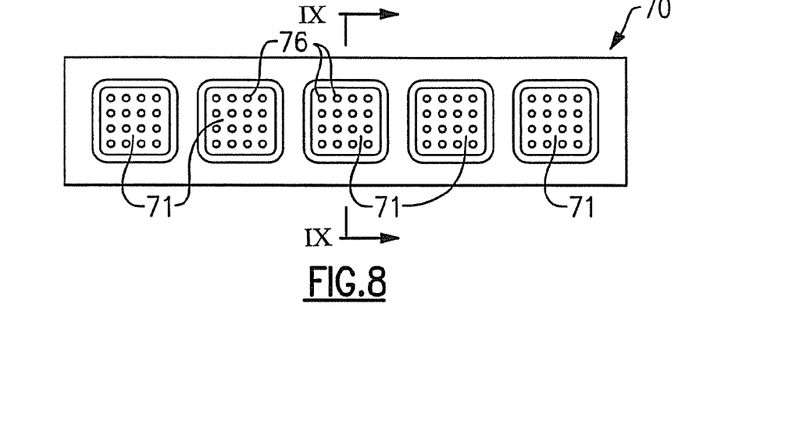
FIG. 8 is an overhead view of an embodiment of a setter in accordance with the present invention.
Figure 9:
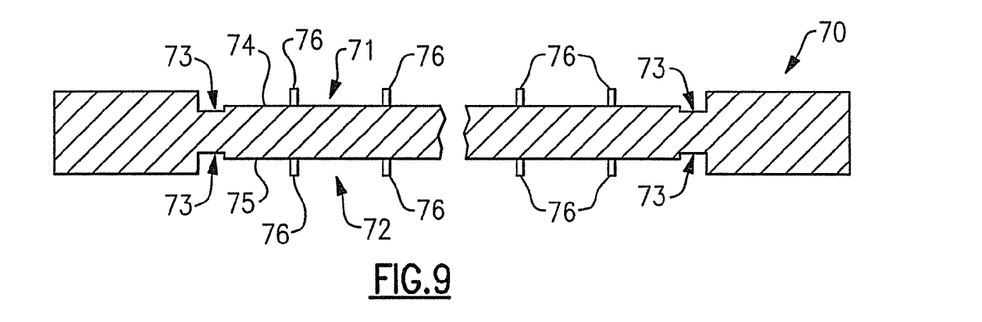
FIG. 9 is a sectional view along line IX-IX of FIG. 8.

The following is a description of a specific preferred embodiment of a setter in accordance with the present invention. FIG. 8 is an overhead view of a setter 70 according to the present invention. Referring to FIG. 8, the top surface of the setter 70 has a plurality of recesses 71 therein. The setter 70 also has a plurality of recesses in its bottom surface, the recesses in the bottom surface being substantially mirror images of the recesses in the top surface. The setter 70 also has a plurality of protrusions 76 extending from the recesses 71. FIG. 9 is a sectional view along line IX-IX of FIG. 8. FIG. 9 shows the setter 70, including a recess 71 on the top surface of the setter 70 and a recess 72 on the bottom surface of the setter 70. As shown in FIG. 9, a perimeter 73 of each recess 71 and 72 is slightly deeper than the remainder of each recess. FIG. 9 also shows a bottom region 74 of the recess 71 and a bottom region of the recess 75. FIG. 9 further shows protrusions 76 extending from each of the recesses 71 and 72.

Figure 10:
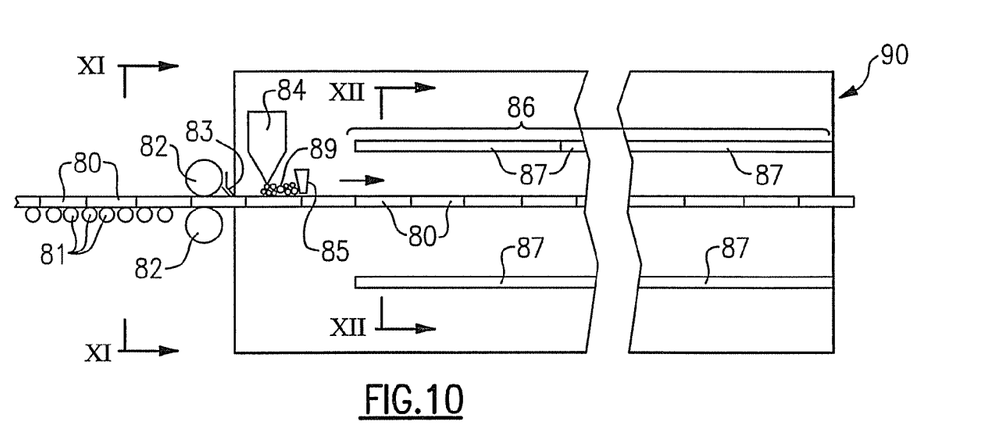
FIG. 10 is a schematic view showing some of the elements of an embodiment of the present invention.
Figure 11:
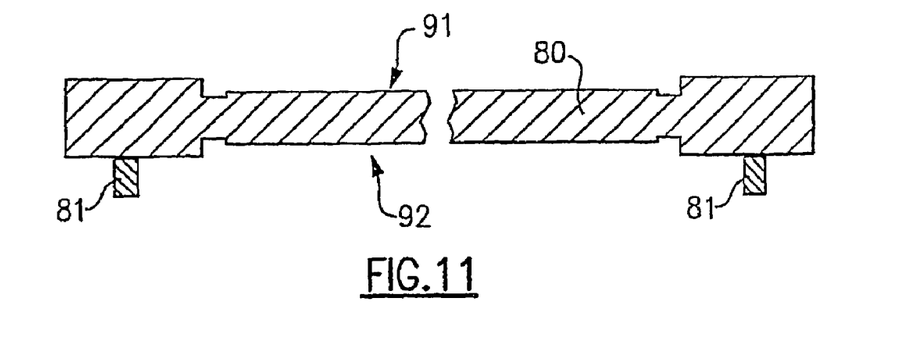
FIG. 11 is a sectional view along line XI-XI of FIG. 10.

The following is a description of a specific preferred embodiment of a fabrication apparatus in accordance with the present invention. FIG. 10 is a schematic view showing some of the elements of this preferred embodiment. Referring to FIG. 10, setters 80 are fed along rollers 81 which push the setters toward a pair of pinch rollers 82. The pinch rollers 82 push the setters through the entire fabrication apparatus 90, so that they pass under a hopper 84, under a doctor blade 85, through a heating/cooling region 86 including a plurality of thermal treatment devices 87, and then out of the fabrication apparatus 90, after which the setters are stored until needed again. The pinch rollers 82 push the setters 80 at a rate which is slower than the rate that the powered rollers 81 push the setters toward the pinch rollers 82, in order to ensure that the setters 80 proceed through the fabrication apparatus 90 substantially end to end. FIG. 11 is a sectional view along line XI-XI, depicting a setter 80 riding along a pair of rollers 81, the view showing a top recess 91 and a bottom recess 92 of the setter 80.

An inert atmosphere is preferably maintained within the fabrication apparatus 90. Preferably, the interior of the fabrication apparatus is sealed in order to assist in preventing the inert materials from escaping from the fabrication apparatus 90.

The setters 80 then pass under a hopper 84 which deposits a desired quantity of semiconductor material 89 (together with any desired additives) into the recesses 91 of the setter which are facing upward. The setters 80 then pass under the doctor blade 85 which smooths the semiconductor material 89 into the recesses 91.

Figure 12:
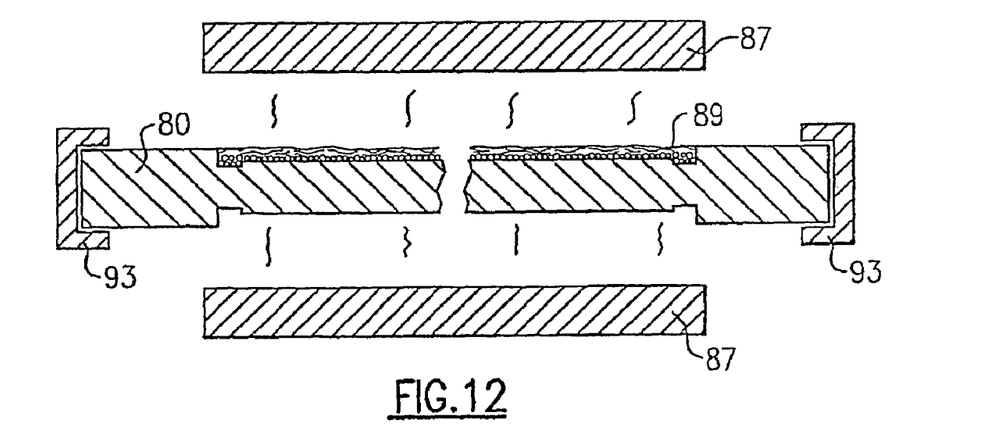
FIG. 12 is a sectional view along line XII-XII of FIG. 10.

The setters 80, along with the semiconductor material 89, are then subjected to a thermal treatment as they pass through the heating/cooling region 86. A plurality of thermal treatment devices 87 are arranged along the path of the setters 80 above and below the setters 80. Each thermal treatment device 87 can be separately controlled, so as to heat or cool the semiconductor material 89 from above or below, thereby enabling any desired thermal profile (as discussed above) to be carried out. FIG. 12 is a sectional view showing a setter 80 as it is passing through one particular zone within the fabrication apparatus 90. Referring to FIG. 12, the setters 80 pass between a thermal treatment device 87 positioned above the path of the setters and a thermal treatment device 87 positioned below the path of the setters, and the setters 80 are guided by a pair of side supports 93 as they pass through the fabrication apparatus 90.

After the setters 80 exit from the fabrication apparatus 90, a wafer is removed from each recess, e.g., by use of a vacuum wand. The setters 80 are stored until they are reused.

Figure 13:
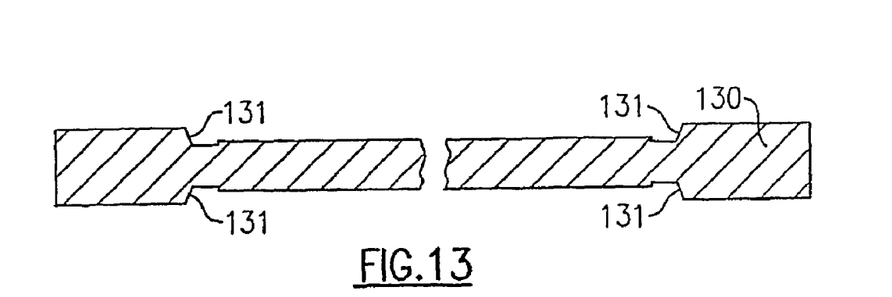
FIG. 13 is a sectional view of an embodiment of a setter in accordance with the present invention.

FIG. 13 is a sectional view of a setter 130 having recesses which have a slight taper in their sidewalls 131.

Any two or more structural parts of the apparatus can be integrated; any structural part of the apparatus can be provided in two or more parts (which are held together, if necessary). Similarly, any two or more functions can be conducted simultaneously, and/or any function can be conducted in a series of steps.

The invention claimed is:

1. A method of fabricating a wafer, comprising:
   depositing at least one semiconductor material for forming the wafer into a recess provided on a first side of a setter, said at least one semiconductor material being in solid form as it is being deposited, said recess having a recess bottom region and a recess sidewall;
   moving said setter including said recess containing said semiconductor material through a heating/cooling region, said heating/cooling region comprising a plurality of zones in which said recess and said semiconductor material are subjected to different temperature conditions; and
   removing from said recess the wafer comprising said semiconductor material.

2. A method of fabricating a wafer as recited in claim 1, further comprising incorporating said wafer in a semiconductor device, said wafer in said semiconductor device having a size which is substantially the same as its size as fabricated.

3. A method of fabricating a wafer as recited in claim 1, wherein said wafer has a first major surface, a second major surface and an edge region, said first major surface being fabricated in contact with said recess bottom region, said second major surface being opposite said first major surface, and said wafer edge region comprising at least one surface between said first major surface and said second major surface, and wherein said setter comprises at least one protrusion extending from said recess bottom region in a direction away from said recess bottom region, such that said wafer has a hole extending from said first major surface to said second major surface.

4. A method of fabricating a wafer as recited in claim 1, wherein said setter comprises at least one valley in said recess bottom region, such that a surface of said wafer correspondingly has at least one ridge.

5. A method of fabricating a wafer as recited in claim 4, wherein said at least one ridge substantially extends around a perimeter of said surface of said wafer.

6. A method of fabricating a wafer as recited in claim 1, wherein said setter comprises at least one ridge in said recess bottom region, such that a surface of said wafer correspondingly has at least one valley.

7. A method of fabricating a wafer as recited in claim 1, wherein a substantial perimeter of said bottom region of said recess is deeper than adjacent regions of said recess such that a substantial perimeter of said wafer is thicker than adjacent regions of said wafer.

8. A method of fabricating a wafer as recited in claim 1, wherein said wafer has a thickness defined from a first major surface of said wafer to a second major surface of said wafer of about 600 micrometers or less.

9. A method of fabricating a wafer as recited in claim 1, further comprising moving said recess containing said semiconductor material through said heating/cooling region at least a second time before said removing said wafer from said recess.

10. A method of fabricating a wafer as recited in claim 1, further comprising placing a setter lid above said recess.

11. A method of fabricating a wafer as recited in claim 1, further comprising contacting said semiconductor material with at least one element selected from the group consisting of a scraper bar, a texturing element, a molding element and a setter lid.

12. A method of fabricating a wafer as recited in claim 11, wherein said wafer has a first major surface, a second major surface and an edge region, said first major surface being fabricated in contact with said recess bottom region, said second major surface being opposite said first major surface, and said wafer edge region comprising at least one surface between said first major surface and said second major surface, and wherein said second major surface has at least one structure formed therein as a result of said contact with said at least one element selected from the group consisting of a scraper bar, a texturing element, a molding element and a setter lid, said structure being selected from the group consisting of a cavity, a ridge, a valley and a hole.

13. A method of fabricating a wafer as recited in claim 11, wherein said wafer has a first major surface, a second major surface and an edge region, said first major surface being fabricated in contact with said recess bottom region, said second major surface being opposite said first major surface, and said wafer edge region comprising at least one surface between said first major surface and said second major surface, and wherein said wafer edge region is rounded as a result of said contact with said at least one element selected from the group consisting of a scraper bar, a texturing element, a molding element and a setter lid.

14. A method of fabricating a wafer as recited in claim 1, wherein said first side of said setter has a plurality of recesses formed therein.

15. A method of fabricating a wafer as recited in claim 1, wherein said recess sidewall is flared such that a cross-sectional area of said recess increases as a distance from said recess bottom region increases.

16. A method of fabricating a wafer as recited in claim 1, wherein at least one recess is formed in a second side of said setter, said second side being opposite said first side, and said method further comprises:
   inverting said setter after said removing a wafer from said recess;
   then depositing at least one semiconductor material into said recess provided on said second side of said setter;

then moving said setter through said heating/cooling region; and then removing from said recess in said second side of said setter a second wafer comprising said semiconductor material.

17. A method of fabricating a wafer as recited in claim 1, wherein for at least a period of time, an entirety of said at least one semiconductor material is molten.

18. A method of fabricating a wafer as recited in claim 17, wherein said period of time is at least 15 seconds.

19. A method of fabricating a wafer as recited in claim 17, wherein said period of time is at least 30 seconds.

20. A method of fabricating a wafer as recited in claim 1, wherein said wafer has a first major surface, a second major surface and an edge region, said first major surface being fabricated in contact with said recess bottom region, said second major surface being opposite said first major surface, and said wafer edge region comprising at least one surface between said first major surface and said second major surface, and wherein said recess bottom region of said setter comprises at least one pattern which results in modified grain structure on said second major surface.

21. A method as recited in claim 1, wherein said semiconductor material is in the form of powder as it is deposited into said recess.

22. A method as recited in claim 1, wherein a portion of said semiconductor material is in contact with said bottom region of said recess after being deposited into said recess.

23. A method of fabricating a wafer, comprising:

depositing at least one semiconductor material into a recess provided on a first side of a setter, said recess having a recess bottom region and a recess sidewall;

moving said setter including said recess containing said semiconductor material through a heating/cooling region, said heating/cooling region comprising a plurality of zones in which said recess and said semiconductor material are subjected to different temperature conditions; and removing from said recess a wafer comprising said semiconductor material, wherein:

said wafer has a first major surface, a second major surface and an edge region, said first major surface being fabricated in contact with said recess bottom region, said second major surface being opposite said first major surface, and said wafer edge region comprising at least one surface between said first major surface and said second major surface, and said setter comprises at least one protrusion extending from said recess bottom region in a direction away from said recess bottom region, such that said wafer has a hole extending from said first major surface to said second major surface.

24. A method of fabricating a wafer, comprising:

depositing at least one semiconductor material into a recess provided on a first side of a setter, said recess having a recess bottom region and a recess sidewall;

moving said setter including said recess containing said semiconductor material through a heating/cooling region, said heating/cooling region comprising a plurality of zones in which said recess and said semiconductor material are subjected to different temperature conditions; and removing from said recess a wafer comprising said semiconductor material, wherein said setter comprises at least one valley in said recess bottom region, such that a surface of said wafer correspondingly has at least one ridge.

25. A method of fabricating a wafer as recited in claim 24, wherein said at least one ridge substantially extends around a perimeter of said surface of said wafer.

26. A method of fabricating a wafer, comprising:

depositing at least one semiconductor material into a recess provided on a first side of a setter, said recess having a recess bottom region and a recess sidewall;

moving said setter including said recess containing said semiconductor material through a heating/cooling region, said heating/cooling region comprising a plurality of zones in which said recess and said semiconductor material are subjected to different temperature conditions; and removing from said recess a wafer comprising said semiconductor material, wherein a substantial perimeter of said bottom region of said recess is deeper than adjacent regions of said recess such that a substantial perimeter of said wafer is thicker than adjacent regions of said wafer.

27. A method of fabricating a wafer, comprising:

depositing at least one semiconductor material into at least a first recess provided on a first side of a setter, said recess having a recess bottom region and a recess sidewall;

moving said setter including said recess containing said semiconductor material through a heating/cooling region, said heating/cooling region comprising a plurality of zones in which said recess and said semiconductor material are subjected to different temperature conditions;

removing from said recess a wafer comprising said semiconductor material;

inverting said setter after said removing a wafer from said recess;

then depositing at least one semiconductor material into at least a second recess, said second recess provided on a second side of said setter, said second side being opposite said first side;

then moving said setter through said heating/cooling region; and then removing from said second recess in said second side of said setter a second wafer comprising said semiconductor material.

28. A method of fabricating a wafer, comprising:

depositing at least one semiconductor material into a recess provided on a first side of a setter, said recess having a recess bottom region and a recess sidewall;

moving said setter including said recess containing said semiconductor material through a heating/cooling region, said recess being open on a top side during at least a portion of said moving said setter through said heating/cooling region, said top side being opposite said recess bottom region, said heating/cooling region comprising a plurality of zones in which said recess and said semiconductor material are subjected to different temperature conditions; and removing from said recess a wafer comprising said semiconductor material.

29. A method as recited in claim 28, wherein said recess is open on said top side during a time when said semiconductor material becomes solidified.

30. A method of fabricating a wafer, comprising:
depositing at least one semiconductor material into a recess provided on a first side of a setter, said recess having a recess bottom region and a recess sidewall;
moving said setter including said recess containing said semiconductor material through a heating/cooling region, said heating/cooling region comprising a plurality of zones in which said recess and said semiconductor material are subjected to different temperature conditions; and
removing from said recess a wafer comprising said semiconductor material,
wherein said setter comprises at least one ridge in said recess bottom region, such that a surface of said wafer correspondingly has at least one valley.

31. A method of fabricating a wafer, comprising:
depositing at least one semiconductor material into a recess provided on a first side of a setter, said recess having a recess bottom region and a recess sidewall;
moving said setter including said recess containing said semiconductor material through a heating/cooling region, said heating/cooling region comprising a plurality of zones in which said recess and said semiconductor material are subjected to different temperature conditions; and
removing from said recess a wafer comprising said semiconductor material,
wherein:
said wafer has a first major surface, a second major surface and an edge region, said first major surface being fabricated in contact with said recess bottom region, said second major surface being opposite said first major surface, and said wafer edge region comprising at least one surface between said first major surface and said second major surface, and
said second major surface has at least one structure formed therein as a result of contact with at least one element selected from the group consisting of a scraper bar, a texturing element, a molding element and a setter lid, said structure being selected from the group consisting of a cavity, a ridge, a valley, a hole and a rounded edge.

32. A method of fabricating a wafer as recited in claim 31, wherein said wafer edge region is rounded as a result of said contact with said at least one element selected from the group consisting of a scraper bar, a texturing element, a molding element and a setter lid.

33. A method of fabricating a wafer, comprising:
depositing at least one semiconductor material into a recess provided on a first side of a setter, said recess having a recess bottom region and a recess sidewall;
moving said setter including said recess containing said semiconductor material through a heating/cooling region, said heating/cooling region comprising a plurality of zones in which said recess and said semiconductor material are subjected to different temperature conditions; and
removing from said recess a wafer comprising said semiconductor material,
wherein:
said wafer has a first major surface, a second major surface and an edge region, said first major surface being fabricated in contact with said recess bottom region, said second major surface being opposite said first major surface, and said wafer edge region comprising at least one surface between said first major surface and said second major surface, and
said recess bottom region of said setter comprises at least one pattern which results in modified grain structure on said second major surface.

* * * * *